United States Patent
Roumi et al.

(10) Patent No.: US 11,681,446 B2
(45) Date of Patent: Jun. 20, 2023

(54) REDUCING POWER FOR MEMORY SUBSYSTEM AND HAVING LATENCY FOR POWER DELIVERY NETWORK

(71) Applicant: Micron Technology, Inc., Boise, ID (US)

(72) Inventors: Mohamed Roumi, Chennai (IN);
Sushil Kumar, Hyderabad (IN);
Tushar Chhabra, Sri Ganganagar (IN);
Sharath Chandra Ambula, Mancherial (IN)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/371,815

(22) Filed: Jul. 9, 2021

(65) Prior Publication Data

US 2022/0011951 A1    Jan. 13, 2022

Related U.S. Application Data

(60) Provisional application No. 63/050,677, filed on Jul. 10, 2020.

(51) Int. Cl.
*G06F 12/00* (2006.01)
*G06F 3/06* (2006.01)

(52) U.S. Cl.
CPC .......... *G06F 3/0625* (2013.01); *G06F 3/0655* (2013.01); *G06F 3/0679* (2013.01)

(58) Field of Classification Search
CPC ... G06F 3/0625; G06F 3/06565; G06F 3/0679
See application file for complete search history.

(56) References Cited

U.S. PATENT DOCUMENTS

| | | | | |
|---|---|---|---|---|
| 2014/0226400 A1* | 8/2014 | Kimura | ........... | G11C 5/147 365/185.08 |
| 2016/0231797 A1* | 8/2016 | Meir | ........... | G06F 3/0625 |

* cited by examiner

*Primary Examiner* — Gurtej Bansal
(74) *Attorney, Agent, or Firm* — Holland & Hart LLP

(57) ABSTRACT

Methods, systems, and devices for power supply control for non-volatile memory are described. A package containing a memory subsystem may include a controller, a volatile memory, and a non-volatile memory. The package may include one or more pins for receiving a supply voltage that may be distributed to the controller, the volatile memory, and the non-volatile memory using one or more power supply rails. The memory subsystem may include one or more switching components along one or more power supply rails to selectively decouple the non-volatile memory from the one or more power supply rails, thereby enabling the non-volatile memory to be powered down separately from the controller and volatile memory. The controller may determine whether to couple or uncouple the non-volatile memory from a power supply rail based on various criteria associated with accessing the non-volatile memory.

24 Claims, 5 Drawing Sheets

REDUCING POWER FOR MEMORY SUBSYSTEM AND HAVING LATENCY FOR POWER DELIVERY NETWORK

CROSS REFERENCE

The present Application for Patent claims the benefit of U.S. Provisional Patent Application No. 63/050,677 by MOHAMED ROUMI et al., entitled "REDUCING POWER FOR MEMORY SUBSYSTEM AND HAVING LATENCY FOR POWER DELIVERY NETWORK," filed Jul. 10, 2020, assigned to the assignee hereof, and expressly incorporated by reference herein.

BACKGROUND

The following relates generally to one or more systems for memory and more specifically to power supply control for non-volatile memory.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

Figure 1:
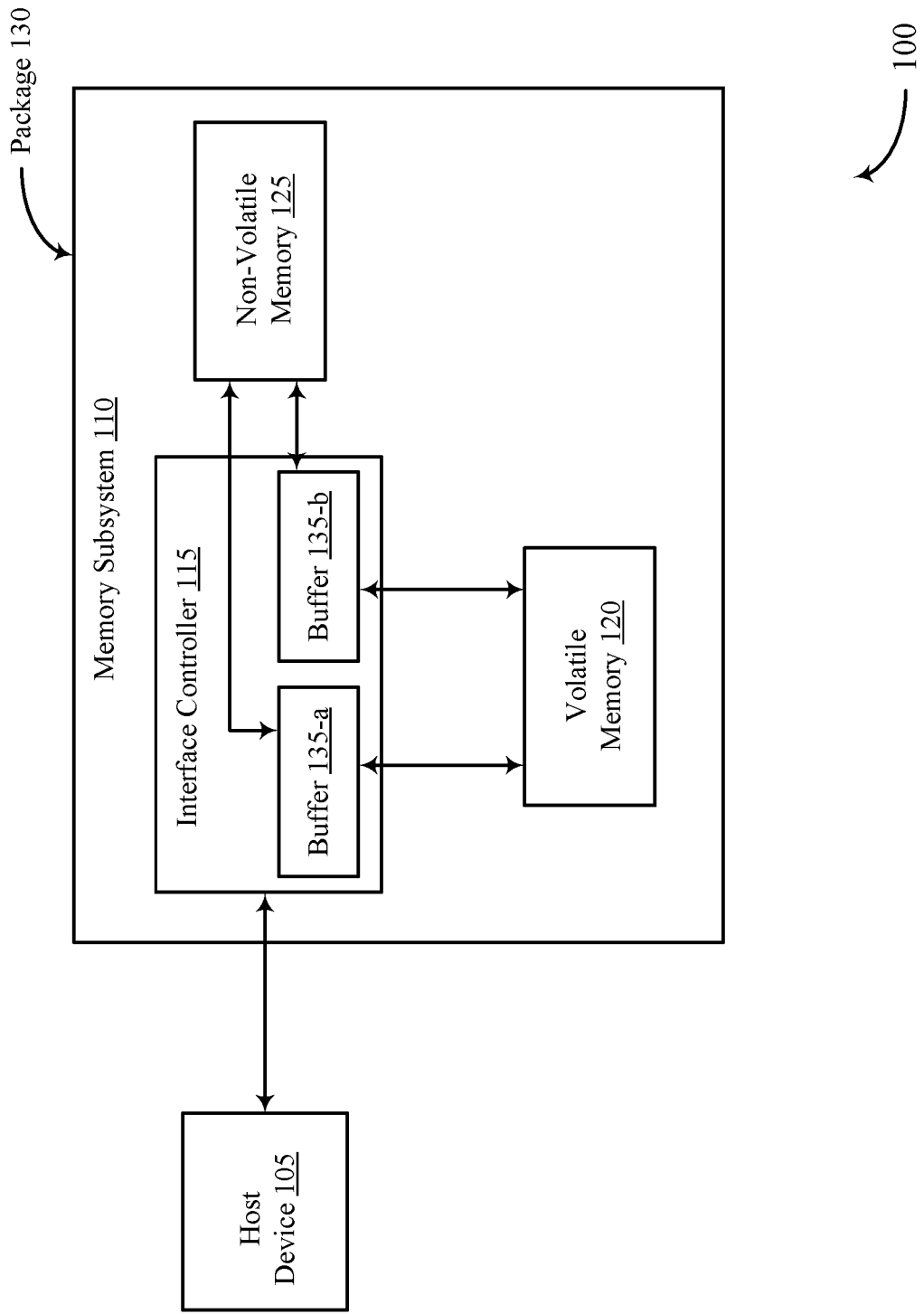
FIG. 1 illustrates an example of a system that supports power supply control for non-volatile memory in accordance with examples as disclosed herein.

In some examples, a memory die may be included in a package that is configured to receive various signals or voltages related to operating the memory die via particular electrical contacts (e.g., balls, pins) of the package. For example, a package may include specific electrical contacts associated with receiving various supply voltages, which may include DC (e.g., constant) voltages such as VDD voltages, among others. Supply voltages received via electrical contacts of the package may be distributed throughout the memory die using power supply rails (e.g., conductive lines).

Some memory subsystems may include a control component (e.g., a controller), a volatile memory, and a non-volatile memory within a single package. To maintain electrical compatibility with other memory packages, a memory subsystem package may use the same electrical contacts for receiving supply voltages, and may distribute the received supply voltages to the controller, the volatile memory, and the non-volatile memory. That is, in some examples, the controller, the volatile memory, and the non-volatile memory may be coupled with the same power supply rails (e.g., a same group of power supply rails).

The controller and the volatile memory, however, may lose their state (e.g., user data, configuration information, or other types of information) when the memory subsystem is powered down (e.g., when the supply voltages are reduced or eliminated), while the non-volatile memory may retain its state. Thus, in some cases, state information from the volatile memory may be stored in the non-volatile memory before powering down the memory subsystem to ensure that information is not lost.

In some examples, a memory subsystem may perform various operations or may operate in various modes during which the memory subsystem does not need to access the non-volatile memory. During such periods, it may be desirable to turn off the power to (e.g., to power down) the non-volatile memory to reduce power consumption of the memory subsystem. Reducing power consumption may be particularly valuable in the context of using a memory subsystem in a device, such as a mobile device, with limited battery life, for example. Because the non-volatile memory may be coupled with the same power supply rails as the controller and the volatile memory, however, it may be difficult or impossible to power down the non-volatile memory without also powering down the controller and the volatile memory.

To address this challenge and reduce power consumption of the memory subsystem, in some examples as described in the present disclosure, the memory subsystem may include switching components along the power supply rails that enable the memory subsystem to selectively uncouple the non-volatile memory from the power supply rails and thereby power down the non-volatile memory separately from the controller and the volatile memory even though the non-volatile memory may receive power via the same power supply rails. A controller in the memory subsystem may activate or deactivate the switching components to couple or uncouple the non-volatile memory with one or more of the power supply rails based on one or more criteria, for example. The switching components may be located on a same die with the non-volatile memory or elsewhere on the memory subsystem package, for example. In some examples, the switching components may be physical switching components (e.g., transistors) rather than being implemented in software or firmware of the non-volatile memory to enable activation of the switching components when the non-volatile memory is powered off.

In some examples, the controller may determine whether to couple or uncouple the non-volatile memory with the power supply rails based on one or more criteria associated with determining whether the controller may receive a command or may otherwise have a reason to (e.g., expects to) access the non-volatile memory. For example, the controller may determine whether the memory subsystem is operating in a given mode, such as a scratchpad mode, in which the memory subsystem is or will be using the volatile memory as a given type of memory, such as scratchpad memory, without accessing the non-volatile memory. In response to determining that the memory subsystem is operating in the mode, such as the scratchpad mode, the controller may uncouple the non-volatile memory from the power supply rails (or, if the non-volatile memory is already uncoupled from the power supply rails, the controller may refrain from coupling the non-volatile memory with the power supply rails).

As another example, the memory subsystem may determine whether data that is needed for an operation (e.g., data requested by a host device based on a command) resides (e.g., is stored) in the volatile memory or in the non-volatile memory. If the data resides in the volatile memory, the controller may uncouple the non-volatile memory from the power supply rails (or, if the non-volatile memory is already uncoupled from the power supply rails, the controller may refrain from coupling the non-volatile memory with the power supply rails).

As yet another example, a memory subsystem may, at times, enter a power-saving mode, such as a sleep mode, in which some or all of the components of memory subsystem may be powered down or may operate on reduced power. For example, the memory subsystem may receive a command that causes the memory subsystem to enter a sleep mode or may enter another operational mode such that components in the memory subsystem are powered down. The memory subsystem may periodically "wake up" (e.g., power up) to send a message or to check for incoming signals, for example. When the memory subsystem wakes up to perform these functions, the memory subsystem may not need to use the non-volatile memory. Thus, in some examples, the controller may determine that the memory subsystem is entering a sleep mode and may deactivate the switching components to uncouple the non-volatile memory from the power supply rails before entering the sleep mode. When the memory subsystem "wakes up," the controller may refrain from coupling the non-volatile memory with the power supply rails, thereby leaving the non-volatile memory powered off to conserve battery life.

Features of the disclosure are initially described in the context of systems and dies as described with reference to FIGS. 1-2. Features of the disclosure are described in the context of a memory subsystem as described with reference to FIG. 3. These and other features of the disclosure are further illustrated by and described with reference to an apparatus diagram and flowcharts that relate to power supply control for non-volatile memory as described with reference to FIGS. 4-5.

FIG. 1 illustrates an example of a system 100 that supports power supply control for non-volatile memory in accordance with examples as disclosed herein. The system 100 may be included in an electronic device such a computer or phone. The system 100 may include a host device 105 and a memory subsystem 110. The host device 105 may be a processor or system-on-a-chip (SoC) that interfaces with the interface controller 115 as well as other components of the electronic device that includes the system 100. The memory subsystem 110 may store and provide access to electronic information (e.g., digital information, data) for the host device 105. The memory subsystem 110 may include an interface controller 115, a volatile memory 120, and a non-volatile memory 125. In some examples, the interface controller 115, the volatile memory 120, and the non-volatile memory 125 may be included in a same physical package such as a package 130. However, the interface controller 115, the volatile memory 120, and the non-volatile memory 125 may be disposed on different, respective dies (e.g., silicon dies).

The devices in the system 100 may be coupled by various conductive lines (e.g., traces, printed circuit board (PCB) routing, redistribution layer (RDL) routing) that may enable the communication of information (e.g., commands, addresses, data) between the devices. The conductive lines may make up channels, data buses, command buses, address buses, and the like.

The memory subsystem 110 may be configured to provide the benefits of the non-volatile memory 125 while maintaining compatibility with a host device 105 that supports protocols for a different type of memory, such as the volatile memory 120, among other examples. For example, the non-volatile memory 125 may provide benefits (e.g., relative to the volatile memory 120) such as non-volatility, higher capacity, or lower power consumption. But the host device 105 may be incompatible or inefficiently configured with various aspects of the non-volatile memory 125. For instance, the host device 105 may support voltages, access latencies, protocols, page sizes, etc. that are incompatible with the non-volatile memory 125. To compensate for the incompatibility between the host device 105 and the non-volatile memory 125, the memory subsystem 110 may be configured with the volatile memory 120, which may be compatible with the host device 105 and serve as a cache for the non-volatile memory 125. Thus, the host device 105 may use protocols supported by the volatile memory 120 while benefitting from the advantages of the non-volatile memory 125.

In some examples, the system 100 may be included in, or coupled with, a computing device, electronic device, mobile computing device, or wireless device. The device may be a portable electronic device. For example, the device may be a computer, a laptop computer, a tablet computer, a smartphone, a cellular phone, a wearable device, an internet-connected device, or the like. In some examples, the device may be configured for bi-directional wireless communication via a base station or access point. In some examples, the device associated with the system 100 may be capable of machine-type communication (MTC), machine-to-machine (M2M) communication, or device-to-device (D2D) communication. In some examples, the device associated with the system 100 may be referred to as a user equipment (UE), station (STA), mobile terminal, or the like.

The host device 105 may be configured to interface with the memory subsystem 110 using a first protocol (e.g., low-power double data rate (LPDDR)) supported by the interface controller 115. Thus, the host device 105 may, in some examples, interface with the interface controller 115 directly and the non-volatile memory 125 and the volatile memory 120 indirectly. In alternative examples, the host device 105 may interface directly with the non-volatile memory 125 and the volatile memory 120. The host device 105 may also interface with other components of the electronic device that includes the system 100. The host device 105 may be or include an SoC, a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In some examples, the host device 105 may be referred to as a host.

The interface controller 115 may be configured to interface with the volatile memory 120 and the non-volatile memory 125 on behalf of the host device 105 (e.g., based on one or more commands or requests issued by the host device 105). For instance, the interface controller 115 may facilitate the retrieval and storage of data in the volatile memory 120 and the non-volatile memory 125 on behalf of the host device 105. Thus, the interface controller 115 may facilitate data transfer between various subcomponents, such as between at least some of the host device 105, the volatile memory 120, or the non-volatile memory 125. The interface controller 115 may interface with the host device 105 and the volatile memory 120 using the first protocol and may interface with the non-volatile memory 125 using a second protocol supported by the non-volatile memory 125. In some examples, interface controller 115 may be referred to as a control component.

The non-volatile memory 125 may be configured to store digital information (e.g., data) for the electronic device that includes the system 100. Accordingly, the non-volatile memory 125 may include an array or arrays of memory cells and a local memory controller configured to operate the array(s) of memory cells. In some examples, the memory cells may be or include FeRAM cells (e.g., the non-volatile memory 125 may be FeRAM). The non-volatile memory 125 may be configured to interface with the interface controller 115 using the second protocol that is different than the first protocol used between the interface controller 115 and the host device 105. In some examples, the non-volatile memory 125 may have a longer latency for access operations than the volatile memory 120. For example, retrieving data from the non-volatile memory 125 may take longer than retrieving data from the volatile memory 120. Similarly, writing data to the non-volatile memory 125 may take longer than writing data to the volatile memory 120. In some examples, the non-volatile memory 125 may have a smaller page size than the volatile memory 120, as described herein.

The volatile memory 120 may be configured to operate as a cache for one or more components, such as the non-volatile memory 125. For example, the volatile memory 120 may store information (e.g., data) for the electronic device that includes the system 100. Accordingly, the volatile memory 120 may include an array or arrays of memory cells and a local memory controller configured to operate the array(s) of memory cells. In some examples, the memory cells may be or include DRAM cells (e.g., the volatile memory may be DRAM). The non-volatile memory 125 may be configured to interface with the interface controller 115 using the first protocol that is used between the interface controller 115 and the host device 105.

In some examples, the volatile memory 120 may have a shorter latency for access operations than the non-volatile memory 125. For example, retrieving data from the volatile memory 120 may take less time than retrieving data from the non-volatile memory 125. Similarly, writing data to the volatile memory 120 may take less time than writing data to the non-volatile memory 125. In some examples, the volatile memory 120 may have a larger page size than the non-volatile memory 125. For instance, the page size of volatile memory 120 may be 2 kilobytes (2 kB) and the page size of non-volatile memory 125 may be 64 bytes (64 B) or 128 bytes (128 B).

Although the non-volatile memory 125 may be a higher-density memory than the volatile memory 120, accessing the non-volatile memory 125 may take longer than accessing the volatile memory 120 (e.g., due to different architectures and protocols, among other reasons). So operating the volatile memory 120 as a cache may reduce latency in the system 100. As an example, an access request for data from the host device 105 may be satisfied relatively quickly by retrieving the data from the volatile memory 120 rather than from the non-volatile memory 125. To facilitate operation of the volatile memory 120 as a cache, the interface controller 115 may include multiple buffers 135. The buffers 135 may be disposed on the same die as the interface controller 115 and may be configured to temporarily store data for transfer between the volatile memory 120, the non-volatile memory 125, or the host device 105 (or any combination thereof) during one or more access operations (e.g., storage and retrieval operations).

An access operation may also be referred to as an access process or access procedure and may involve one or more sub-operations that are performed by one or more of the components of the memory subsystem 110. Examples of access operations may include storage operations in which data provided by the host device 105 is stored (e.g., written to) in the volatile memory 120 or the non-volatile memory 125 (or both), and retrieval operations in which data requested by the host device 105 is obtained (e.g., read) from the volatile memory 120 or the non-volatile memory 125 and is returned to the host device 105.

To store data in the memory subsystem 110, the host device 105 may initiate a storage operation (or "storage process") by transmitting a storage command (also referred to as a storage request, a write command, or a write request) to the interface controller 115. The storage command may target a set of non-volatile memory cells in the non-volatile memory 125. In some examples, a set of memory cells may also be referred to as a portion of memory. The host device 105 may also provide the data to be written to the set of non-volatile memory cells to the interface controller 115. The interface controller 115 may temporarily store the data in the buffer 135-a. After storing the data in the buffer 135-a, the interface controller 115 may transfer the data from the buffer 135-a to the volatile memory 120 or the non-volatile memory 125 or both. In write-through mode, the interface controller 115 may transfer the data to both the volatile memory 120 and the non-volatile memory 125. In write-back mode, the interface controller 115 may only transfer the data to the volatile memory 120.

In either mode, the interface controller 115 may identify an appropriate set of one or more volatile memory cells in the volatile memory 120 for storing the data associated with the storage command. To do so, the interface controller 115 may implement set-associative mapping in which each set (e.g., block) of one or more non-volatile memory cells in the non-volatile memory 125 may be mapped to multiple sets of volatile memory cells in the volatile memory 120. For instance, the interface controller 115 may implement n-way associative mapping which allows data from a set of non-volatile memory cells to be stored in one of n sets of volatile memory cells in the volatile memory 120. Thus, the interface controller 115 may manage the volatile memory 120 as a cache for the non-volatile memory 125 by referencing the n sets of volatile memory cells associated with a targeted set of non-volatile memory cells. As used herein, a "set" of objects may refer to one or more of the objects unless otherwise described or noted. Although described with reference to set-associative mapping, the interface controller 115 may manage the volatile memory 120 as a cache by implementing one or more other types of mapping such as direct mapping or associative mapping, among other examples.

After determining which n sets of volatile memory cells are associated with the targeted set of non-volatile memory cells, the interface controller 115 may store the data in one or more of the n sets of volatile memory cells. This way, a subsequent retrieval command from the host device 105 for the data can be efficiently satisfied by retrieving the data from the lower-latency volatile memory 120 instead of retrieving the data from the higher-latency non-volatile memory 125. The interface controller 115 may determine which of the n sets of the volatile memory 120 to store the data based on one or more parameters associated with the data stored in the n sets of the volatile memory 120, such as the validity, age, or modification status of the data. Thus, a storage command by the host device 105 may be wholly (e.g., in write-back mode) or partially (e.g., in write-through mode) satisfied by storing the data in the volatile memory 120. To track the data stored in the volatile memory 120, the interface controller 115 may store for one or more sets of volatile memory cells (e.g., for each set of volatile memory cells) a tag address that indicates the non-volatile memory cells with data stored in a given set of volatile memory cells.

To retrieve data from the memory subsystem 110, the host device 105 may initiate a retrieval operation (also referred to as a retrieval process) by transmitting a retrieval command (also referred to as a retrieval request, a read command, or a read request) to the interface controller 115. The retrieval command may target a set of one or more non-volatile memory cells in the non-volatile memory 125. Upon receiving the retrieval command, the interface controller 115 may check for the requested data in the volatile memory 120. For instance, the interface controller 115 may check for the requested data in the n sets of volatile memory cells associated with the targeted set of non-volatile memory cells. If one of the n sets of volatile memory cells stores the requested data (e.g., stores data for the targeted set of non-volatile memory cells), the interface controller 115 may transfer the data from the volatile memory 120 to the buffer 135-a so that it can be transmitted to the host device 105. The term "hit" may be used to refer to the scenario where the volatile memory 120 stores data requested by the host device 105. If then sets of one or more volatile memory cells do not store the requested data (e.g., then sets of volatile memory cells store data for a set of non-volatile memory cells other than the targeted set of non-volatile memory cells), the interface controller 115 may transfer the requested data from the non-volatile memory 125 to the buffer 135-a so that it can be transmitted to the host device 105. The term "miss" may be used to refer to the scenario where the volatile memory 120 does not store data requested by the host device 105.

In a miss scenario, after transferring the requested data to the buffer 135-a, the interface controller 115 may transfer the requested data from the buffer 135-a to the volatile memory 120 so that subsequent read requests for the data can be satisfied by the volatile memory 120 instead of the non-volatile memory 125. For example, the interface controller 115 may store the data in one of the n sets of volatile memory cells associated with the targeted set of non-volatile memory cells. But the n sets of volatile memory cells may already be storing data for other sets of non-volatile memory cells. So, to preserve this other data, the interface controller 115 may transfer the other data to the buffer 135-b so that it can be transferred to the non-volatile memory 125 for storage. Such a process may be referred to as "eviction" and the data transferred from the volatile memory 120 to the buffer 135-b may be referred to as "victim" data. In some cases, the interface controller 115 may transfer a subset of the victim data from the buffer 135-b to the non-volatile memory 125. For example, the interface controller 115 may transfer one or more subsets of victim data that have changed since the data was initially stored in the non-volatile memory 125. Data that is inconsistent between the volatile memory 120 and the non-volatile memory 125 (e.g., due to an update in one memory and not the other) may be referred to in some cases as "modified" or "dirty" data. In some examples (e.g., when interface controller operates in one mode such as a write-back mode), dirty data may be data that is present in the volatile memory 120 but not present in the non-volatile memory 125.

In some examples, memory subsystem 110 may be configured to receive one or more supply voltages via one or more pins of memory subsystem 110, and distribute the one or more supply voltages to the interface controller 115, the volatile memory 120, and the non-volatile memory 125 using one or more power supply rails (e.g., conductive paths within memory subsystem 110). In some examples, memory subsystem 110 may include one or more switching components coupled between the power supply rails and non-volatile memory 125 to enable interface controller 115 to power down non-volatile memory 125 independent from interface controller 115 and volatile memory 120. Interface controller 115 may determine whether to power down non-volatile memory 125 based on a variety of criteria associated with accessing non-volatile memory 125, as described in more detail with reference to FIG. 3.

Figure 2:
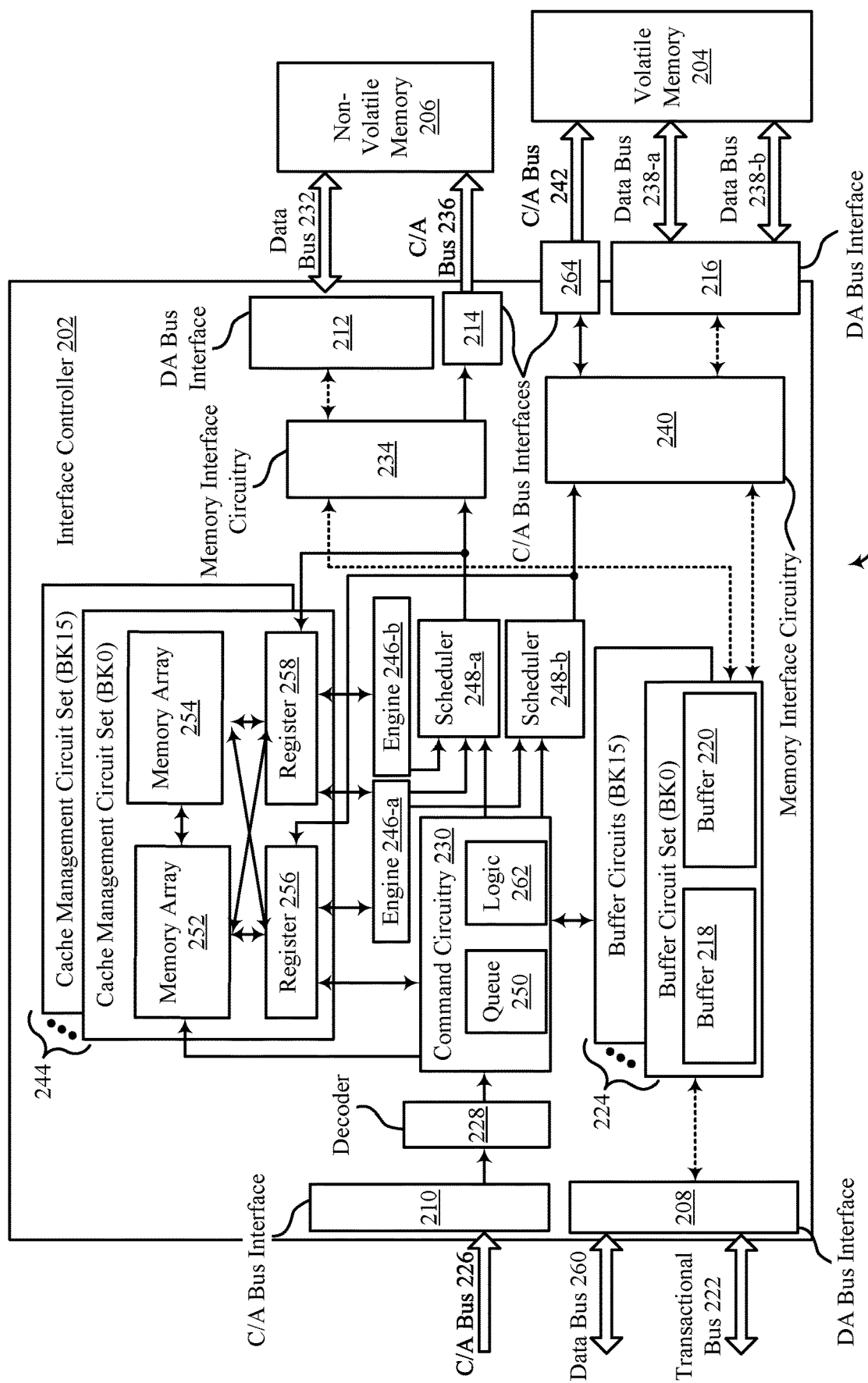
FIG. 2 illustrates an example of a memory subsystem that supports power supply control for non-volatile memory in accordance with examples as disclosed herein.

FIG. 2 illustrates an example of memory subsystem 200 that supports power supply control for non-volatile memory in accordance with examples as disclosed herein. The memory subsystem 200 may be an example of the memory subsystem 110 described with reference to FIG. 1. Accordingly, the memory subsystem 200 may interact with a host device as described with reference to FIG. 1. The memory subsystem 200 may include an interface controller 202, a volatile memory 204, and a non-volatile memory 206, which may be examples of the interface controller 115, the volatile memory 120, and the non-volatile memory 125, respectively, as described with reference to FIG. 1. Thus, the interface controller 202 may interface with the volatile memory 204 and the non-volatile memory 206 on behalf of the host device as described with reference to FIG. 1. For example, the interface controller 202 may operate the volatile memory 204 as a cache for the non-volatile memory 206. Operating the volatile memory 204 as the cache may allow subsystem to provide the benefits of the non-volatile memory 206 (e.g., non-volatile, high-density storage) while maintaining compatibility with a host device that supports a different protocol than the non-volatile memory 206.

In FIG. 2, dashed lines between components represent the flow of data or communication paths for data and solid lines between components represent the flow of commands or communication paths for commands. In some cases, the memory subsystem 200 is one of multiple similar or identical subsystems that may be included in an electronic device. Each subsystem may be referred to as a slice and may be associated with a respective channel of a host device in some examples.

The non-volatile memory 206 may be configured to operate as a main memory (e.g., memory for long-term data storage) for a host device. In some cases, the non-volatile memory 206 may include one or more arrays of FeRAM cells. Each FeRAM cell may include a selection component and a ferroelectric capacitor, and may be accessed by applying appropriate voltages to one or more access lines such as word lines, plates lines, and digit lines. In some examples, a subset of FeRAM cells coupled with to an activated word line may be sensed, for example concurrently or simultaneously, without having to sense all FeRAM cells coupled with the activated word line. Accordingly, a page size for an FeRAM array may be different than (e.g., smaller than) a DRAM page size. In the context of a memory device, a page may refer to the memory cells in a row (e.g., a group of the memory cells that have a common row address) and a page size may refer to the number of memory cells or column addresses in a row, or the number of column addresses accessed during an access operation. Alternatively, a page size may refer to a size of data handled by various interfaces. In some cases, different memory device types may have different page sizes. For example, a DRAM page size (e.g., 2 kB) may be a superset of a non-volatile memory (e.g., FeRAM) page size (e.g., 64 B).

A smaller page size of an FeRAM array may provide various efficiency benefits, as an individual FeRAM cell may require more power to read or write than an individual DRAM cell. For example, a smaller page size for an FeRAM array may facilitate effective energy usage because a smaller number of FeRAM cells may be activated when an associated change in information is minor. In some examples, the page size for an array of FeRAM cells may vary, for example dynamically (e.g., during operation of the array of FeRAM cells) depending on the nature of data and command utilizing FeRAM operation.

Although an individual FeRAM cell may require more power to read or write than an individual DRAM cell, an FeRAM cell may maintain its stored logic state for an extended period of time in the absence of an external power source, as the ferroelectric material in the FeRAIVI cell may maintain a non-zero electric polarization in the absence of an electric field. Therefore, including an FeRAM array in the non-volatile memory 206 may provide efficiency benefits relative to volatile memory cells (e.g., DRAM cells in the volatile memory 204), as it may reduce or eliminate requirements to perform refresh operations.

The volatile memory 204 may be configured to operate as a cache for the non-volatile memory 206. In some cases, the volatile memory 204 may include one or more arrays of DRAM cells. Each DRAM cell may include a capacitor that includes a dielectric material to store a charge representative of the programmable state. The memory cells of the volatile memory 204 may be logically grouped or arranged into one or more memory banks (as referred to herein as "banks"). For example, volatile memory 204 may include sixteen banks. The memory cells of a bank may be arranged in a grid or an array of intersecting columns and rows and each memory cell may be accessed or refreshed by applying appropriate voltages to the digit line (e.g., column line) and word line (e.g., row line) for that memory cell. The rows of a bank may be referred to pages, and the page size may refer to the number of columns or memory cells in a row. As noted, the page size of the volatile memory 204 may be different than (e.g., larger than) the page size of the non-volatile memory 206.

The interface controller 202 may include various circuits for interfacing (e.g., communicating) with other devices, such as a host device, the volatile memory 204, and the non-volatile memory 206. For example, the interface controller 202 may include a data (DA) bus interface 208, a command and address (C/A) bus interface 210, a data bus interface 212, a C/A bus interface 214, a data bus interface 216, and a C/A bus interface 264. The data bus interfaces may support the communication of information using one or more communication protocols. For example, the data bus interface 208, the C/A bus interface 210, the data bus interface 216, and the C/A bus interface 264 may support information that is communicated using a first protocol (e.g., LPDDR signaling), whereas the data bus interface 212 and the C/A bus interface 214 may support information communicated using a second protocol. Thus, the various bus interfaces coupled with the interface controller 202 may support different amounts of data or data rates.

The data bus interface 208 may be coupled with the data bus 260, the transactional bus 222, and the buffer circuitry 224. The data bus interface 208 may be configured to transmit and receive data over the data bus 260 and control information (e.g., acknowledgements/negative acknowledgements) or metadata over the transactional bus 222. The data bus interface 208 may also be configured to transfer data between the data bus 260 and the buffer circuitry 224. The data bus 260 and the transactional bus 222 may be coupled with the interface controller 202 and the host device such that a conductive path is established between the interface controller 202 and the host device. In some examples, the pins of the transactional bus 222 may be referred to as data mask inversion (DMI) pins. Although shown with one data bus 260 and one transactional bus 222, there may be any number of data buses 260 and any number of transactional buses 222 coupled with one or more data bus interfaces 208.

The C/A bus interface 210 may be coupled with the C/A bus 226 and the decoder 228. The C/A bus interface 210 may be configured to transmit and receive commands and addresses over the C/A bus 226. The commands and addresses received over the C/A bus 226 may be associated with data received or transmitted over the data bus 260. The C/A bus interface 210 may also be configured to transmit commands and addresses to the decoder 228 so that the decoder 228 can decode the commands and relay the decoded commands and associated addresses to the command circuitry 230.

The data bus interface 212 may be coupled with the data bus 232 and the memory interface circuitry 234. The data bus interface 212 may be configured to transmit and receive data over the data bus 232, which may be coupled with the non-volatile memory 206. The data bus interface 212 may also be configured to transfer data between the data bus 232 and the memory interface circuitry 234. The C/A bus interface 214 may be coupled with the C/A bus 236 and the memory interface circuitry 234. The C/A bus interface 214 may be configured to receive commands and addresses from the memory interface circuitry 234 and relay the commands and the addresses to the non-volatile memory 206 (e.g., to a local controller of the non-volatile memory 206) over the C/A bus 236. The commands and the addresses transmitted over the C/A bus 236 may be associated with data received or transmitted over the data bus 232. The data bus 232 and the C/A bus 236 may be coupled with the interface controller 202 and the non-volatile memory 206 such that conductive paths are established between the interface controller 202 and the non-volatile memory 206.

The data bus interface 216 may be coupled with the data buses 238 and the memory interface circuitry 240. The data bus interface 216 may be configured to transmit and receive data over the data buses 238, which may be coupled with the volatile memory 204. The data bus interface 216 may also be configured to transfer data between the data buses 238 and the memory interface circuitry 240. The C/A bus interface 264 may be coupled with the C/A bus 242 and the memory interface circuitry 240. The C/A bus interface 264 may be configured to receive commands and addresses from the memory interface circuitry 240 and relay the commands and the addresses to the volatile memory 204 (e.g., to a local controller of the volatile memory 204) over the C/A bus 242. The commands and addresses transmitted over the C/A bus 242 may be associated with data received or transmitted over the data buses 238. The data bus 238 and the C/A bus 242 may be coupled with the interface controller 202 and the volatile memory 204 such that conductive paths are established between the interface controller 202 and the volatile memory 204.

In addition to buses and bus interfaces for communicating with coupled devices, the interface controller 202 may include circuitry for operating the non-volatile memory 206 as a main memory and the volatile memory 204 as a cache. For example, the interface controller 202 may include command circuitry 230, buffer circuitry 224, cache management circuitry 244, one or more engines 246, and one or more schedulers 248.

The command circuitry 230 may be coupled with the buffer circuitry 224, the decoder 228, the cache management circuitry 244, and the schedulers 248, among other components. The command circuitry 230 may be configured to receive command and address information from the decoder 228 and store the command and address information in the queue 250. The command circuitry 230 may include logic 262 that processes command information (e.g., from a host device) and storage information from other components (e.g., the cache management circuitry 244, the buffer circuitry 224) and uses that information to generate one or more commands for the schedulers 248. The command circuitry 230 may also be configured to transfer address information (e.g., address bits) to the cache management circuitry 244. In some examples, the logic 26 2522 may be a circuit configured to operate as a finite state machine (FSM).

The buffer circuitry 224 may be coupled with the data bus interface 208, the command circuitry 230, the memory interface circuitry 234, and the memory interface circuitry 234. The buffer circuitry 224 may include a set of one or more buffer circuits for at least some banks, if not each bank, of the volatile memory 204. The buffer circuitry 224 may also include components (e.g., a memory controller) for accessing the buffer circuits. In one example, the volatile memory 204 may include sixteen banks and the buffer circuitry 224 may include sixteen sets of buffer circuits. Each set of the buffer circuits may be configured to store data from or for (or both) a respective bank of the volatile memory 204. As an example, the buffer circuit set for bank 0 (BK0) may be configured to store data from or for (or both) the first bank of the volatile memory 204 and the buffer circuit for bank 15 (BK15) may be configured to store data from or for (or both) the sixteenth bank of the volatile memory 204.

Each set of buffer circuits in the buffer circuitry 224 may include a pair of buffers. The pair of buffers may include one buffer (e.g., an open page data (OPD) buffer) configured to store data targeted by an access command (e.g., a storage command or retrieval command) from the host device and another buffer (e.g., a victim page data (VPD) buffer) configured to store data for an eviction process that results from the access command. For example, the buffer circuit set for BK0 may include the buffer 218 and the buffer 220, which may be examples of buffer 135-a and 135-b, respectively. The buffer 218 may be configured to store BK0 data that is targeted by an access command from the host device. And the buffer 220 may be configured to store data that is transferred from BK0 as part of an eviction process triggered by the access command. Each buffer in a buffer circuit set may be configured with a size (e.g., storage capacity) that corresponds to a page size of the volatile memory 204. For example, if the page size of the volatile memory 204 is 2 kB, the size of each buffer may be 2 kB. Thus, the size of the buffer may be equivalent to the page size of the volatile memory 204 in some examples.

The cache management circuitry 244 may be coupled with the command circuitry 230, the engines 246, and the schedulers 248, among other components. The cache management circuitry 244 may include a cache management circuit set for one or more banks (e.g., each bank) of volatile memory. As an example, the cache management circuitry 244 may include sixteen cache management circuit sets for BK0 through BK15. Each cache management circuit set may include two memory arrays that may be configured to store storage information for the volatile memory 204. As an example, the cache management circuit set for BK0 may include a memory array 252 (e.g., a CDRAM Tag Array (CDT-TA)) and a memory array 254 (e.g., a CDRAM Valid (CDT-V) array), which may be configured to store storage information for BK0. The memory arrays may also be referred to as arrays or buffers in some examples. In some cases, the memory arrays may be or include volatile memory cells, such as SRAM cells.

Storage information may include content information, validity information, or dirty information (or any combination thereof) associated with the volatile memory 204. Content information (which may also be referred to as tag information or address information) may indicate which data is stored in a set of volatile memory cells. For example, the content information (e.g., a tag address) for a set of one or more volatile memory cells may indicate which set of one or more non-volatile memory cells currently has data stored in the set of one or more volatile memory cells. Validity information may indicate whether the data stored in a set of volatile memory cells is actual data (e.g., data having an intended order or form) or placeholder data (e.g., data being random or dummy, not having an intended or important order). And dirty information may indicate whether the data stored in a set of one or more volatile memory cells of the volatile memory 204 is different than corresponding data stored in a set of one or more non-volatile memory cells of the non-volatile memory 206. For example, dirty information may indicate whether data stored in a set of volatile memory cells has been updated relative to data stored in the non-volatile memory 206.

The memory array 252 may include memory cells that store storage information (e.g., content and validity information) for an associated bank (e.g., BK0) of the volatile memory 204. The storage information may be stored on a per-page basis (e.g., there may be respective storage information for each page of the associated non-volatile memory bank). The interface controller 202 may check for requested data in the volatile memory 204 by referencing the storage information in the memory array 252. For instance, the interface controller 202 may receive, from a host device, a retrieval command for data in a set of non-volatile memory cells in the non-volatile memory 206. The interface controller 202 may use a set of one or more address bits (e.g., a set of row address bits) targeted by the access request to reference the storage information in the memory array 252. For instance, using set-associative mapping, the interface controller 202 may reference the content information in the memory array 252 to determine which set of volatile memory cells, if any, stores the requested data.

In addition to storing content information for volatile memory cells, the memory array 252 may also store validity information that indicates whether the data in a set of volatile memory cells is actual data (also referred to as valid data) or random data (also referred to as invalid data). For example, the volatile memory cells in the volatile memory 204 may initially store random data and continue to do so until the volatile memory cells are written with data from a host device or the non-volatile memory 206. To track which data is valid, the memory array 252 may be configured to set a bit for each set of volatile memory cells when actual data is stored in that set of volatile memory cells. This bit may be referred to a validity bit or a validity flag. As with the content information, the validity information stored in the memory array 252 may be stored on a per-page basis. Thus, each validity bit may indicate the validity of data stored in an associated page in some examples.

The memory array 254 may be similar to the memory array 252 and may also include memory cells that store validity information for a bank (e.g., BK0) of the volatile memory 204 that is associated with the memory array 252. However, the validity information stored in the memory array 254 may be stored on a sub-block basis as opposed to a per-page basis for the memory array 252. For example, the validity information stored in the memory cells of the memory array 254 may indicate the validity of data for subsets of volatile memory cells in a set (e.g., page) of volatile memory cells. As an example, the validity information in the memory array 254 may indicate the validity of each subset (e.g., 64 B) of data in a page of data stored in BK0 of the volatile memory 204. Storing content information and validity information on a per-page basis in the memory array 252 may allow the interface controller 202 to quickly and efficiently determine whether there is a hit or miss for data in the volatile memory 204. Storing validity information on a sub-block basis may allow the interface controller 202 to determine which subsets of data to preserve in the non-volatile memory 206 during an eviction process.

Each cache management circuit set may also include a respective pair of registers coupled with the command circuitry 230, the engines 246, the memory interface circuitry 234, the memory interface circuitry 240, and the memory arrays for that cache management circuit set, among other components. For example, a cache management circuit set may include a first register (e.g., a register 256 which may be an open page tag (OPT) register) configured to receive storage information (e.g., one or more bits of tag information, validity information, or dirty information) from the memory array 252 or the scheduler 248-*b* or both. The cache management circuitry set may also include a second register (e.g., a register 258 which may be a victim page tag (VPT) register) configured to receive storage information from the memory array 254 and the scheduler 248-*a* or both. The information in the register 256 and the register 258 may be transferred to the command circuitry 230 and the engines 246 to enable decision-making by these components. For example, the command circuitry 230 may issue commands for reading the non-volatile memory 206 or the volatile memory 204 based on content information from the register 256.

The engine 246-*a* may be coupled with the register 256, the register 258, and the schedulers 248. The engine 246-*a* may be configured to receive storage information from various components and issue commands to the schedulers 248 based on the storage information. For example, when the interface controller 202 is in a first mode such as a write-through mode, the engine 246-*a* may issue commands to the scheduler 248-*b* and in response the scheduler 248-*b* to initiate or facilitate the transfer of data from the buffer 218 to both the volatile memory 204 and the non-volatile memory 206. Alternatively, when the interface controller 202 is in a second mode such as a write-back mode, the engine 246-*a* may issue commands to the scheduler 248-*b* and in response the scheduler 248-*b* may initiate or facilitate the transfer of data from the buffer 218 to the volatile memory 204. In the event of a write-back operation, the data stored in the volatile memory 204 may eventually be transferred to the non-volatile memory 206 during a subsequent eviction process.

The engine 246-*b* may be coupled with the register 258 and the scheduler 248-*a*. The engine 246-*b* may be configured to receive storage information from the register 258 and issue commands to the scheduler 248-*a* based on the storage information. For instance, the engine 246-*b* may issue commands to the scheduler 248-*a* to initiate or facilitate transfer of dirty data from the buffer 220 to the non-volatile memory 206 (e.g., as part of an eviction process). If the buffer 220 holds a set of data transferred from the volatile memory 204 (e.g., victim data), the engine 246-*b* may indicate which one or more subsets (e.g., which 64 B) of the set of data in the buffer 220 should be transferred to the non-volatile memory 206.

The scheduler 248-*a* may be coupled with various components of the interface controller 202 and may facilitate accessing the non-volatile memory 206 by issuing commands to the memory interface circuitry 234. The commands issued by the scheduler 248-*a* may be based on commands from the command circuitry 230, the engine 246-*a*, the engine 246-*b*, or a combination of these components. Similarly, the scheduler 248-*b* may be coupled with various components of the interface controller 202 and may facilitate accessing the volatile memory 204 by issuing commands to the memory interface circuitry 240. The commands issued by the scheduler 248-*b* may be based on commands from the command circuitry 230 or the engine 246-*a*, or both.

The memory interface circuitry 234 may communicate with the non-volatile memory 206 via one or more of the data bus interface 212 and the C/A bus interface 214. For example, the memory interface circuitry 234 may prompt the C/A bus interface 214 to relay commands issued by the memory interface circuitry 234 over the C/A bus 236 to a local controller in the non-volatile memory 206. And the memory interface circuitry 234 may transmit to, or receive data from, the non-volatile memory 206 over the data bus 232. In some examples, the commands issued by the memory interface circuitry 234 may be supported by the non-volatile memory 206 but not the volatile memory 204 (e.g., the commands issued by the memory interface circuitry 234 may be different than the commands issued by the memory interface circuitry 240).

The memory interface circuitry 240 may communicate with the volatile memory 204 via one or more of the data bus interface 216 and the C/A bus interface 264. For example, the memory interface circuitry 240 may prompt the C/A bus interface 264 to relay commands issued by the memory interface circuitry 240 over the C/A bus 242 to a local controller of the volatile memory 204. And the memory interface circuitry 240 may transmit to, or receive data from, the volatile memory 204 over one or more data buses 238. In some examples, the commands issued by the memory interface circuitry 240 may be supported by the volatile memory 204 but not the non-volatile memory 206 (e.g., the commands issued by the memory interface circuitry 240 may be different than the commands issued by the memory interface circuitry 234).

Together, the components of the interface controller 202 may operate the non-volatile memory 206 as a main memory and the volatile memory 204 as a cache. Such operation may be prompted by one or more access commands (e.g., read/retrieval commands/requests and write/storage commands/requests) received from a host device.

In some examples, the interface controller 202 may receive a storage command from the host device. The storage command may be received over the C/A bus 226 and transferred to the command circuitry 230 via one or more of the C/A bus interface 210 and the decoder 228. The storage command may include or be accompanied by address bits that target a memory address of the non-volatile memory 206. The data to be stored may be received over the data bus 260 and transferred to the buffer 218 via the data bus interface 208. In a write-through mode, the interface controller 202 may transfer the data to both the non-volatile memory 206 and the volatile memory 204. In a write-back mode, the interface controller 202 may transfer the data to only the volatile memory 204. In either mode, the interface controller 202 may first check to see if the volatile memory 204 has memory cells available to store the data. To do so, the command circuitry 230 may reference the memory array 252 (e.g., using a set of the memory address bits) to determine whether one or more of the n sets (e.g., pages) of volatile memory cells associated with the memory address are empty (e.g., store random or invalid data). In some cases, a set of volatile memory cells in the volatile memory 204 may be referred to as a line or cache line.

If one of the n associated sets of volatile memory cells is available for storing information, the interface controller 202 may transfer the data from the buffer 218 to the volatile memory 204 for storage in that set of volatile memory cells. But if no associated sets of volatile memory cells are empty, the interface controller 202 may initiate an eviction process to make room for the data in the volatile memory 204. The eviction process may involve transferring the old data (e.g., existing data) in one of the n associated sets of volatile memory cells to the buffer 220. The dirty information for the old data may also be transferred to the memory array 254 or register 258 for identification of dirty subsets of the old data. After the old data is stored in the buffer 220, the new data can be transferred from the buffer 218 to the volatile memory 204 and the old data can be transferred from the buffer 220 to the non-volatile memory 206. In some cases, dirty subsets of the old data are transferred to the non-volatile memory 206 and clean subsets (e.g., unmodified subsets) are discarded. The dirty subsets may be identified by the engine 246-b based on dirty information transferred (e.g., from the volatile memory 204) to the memory array 254 or register 258 during the eviction process.

In another example, the interface controller 202 may receive a retrieval command from the host device. The retrieval command may be received over the C/A bus 226 and transferred to the command circuitry 230 via one or more of the C/A bus interface 210 and the decoder 228. The retrieval command may include address bits that target a memory address of the non-volatile memory 206. Before attempting to access the targeted memory address of the non-volatile memory 206, the interface controller 202 may check to see if the volatile memory 204 stores the data. To do so, the command circuitry 230 may reference the memory array 252 (e.g., using a set of the memory address bits) to determine whether one or more of the n sets of volatile memory cells associated with the memory address stores the requested data. If the requested data is stored in the volatile memory 204, the interface controller 202 may transfer the requested data to the buffer 218 for transmission to the host device over the data bus 260.

If the requested data is not stored in the volatile memory 204, the interface controller 202 may retrieve the data from the non-volatile memory 206 and transfer the data to the buffer 218 for transmission to the host device over the data bus 260. Additionally, the interface controller 202 may transfer the requested data from the buffer 218 to the volatile memory 204 so that the data can be accessed with a lower latency during a subsequent retrieval operation. Before transferring the requested data, however, the interface controller 202 may first determine whether one or more of the n associated sets of volatile memory cells are available to store the requested data. The interface controller 202 may determine the availability of the n associated sets of volatile memory cells by communicating with the related cache management circuit set. If an associated set of volatile memory cells is available, the interface controller 202 may transfer the data in the buffer 218 to the volatile memory 204 without performing an eviction process. Otherwise, the interface controller 202 may transfer the data from the buffer 218 to the volatile memory 204 after performing an eviction process.

The memory subsystem 200 may be implemented in one or more configurations, including one-chip versions and multi-chip versions. A multi-chip version may include one or more constituents of the memory subsystem 200, including the interface controller 202, the volatile memory 204, and the non-volatile memory 206 (among other constituents or combinations of constituents), on a chip that is separate from a chip that includes one or more other constituents of the memory subsystem 200. For example, in one multi-chip version, respective separate chips may include each of the interface controller 202, the volatile memory 204, and the non-volatile memory 206. In contrast, a one-chip version may include the interface controller 202, the volatile memory 204, and the non-volatile memory 206 on a single chip.

Figure 3:
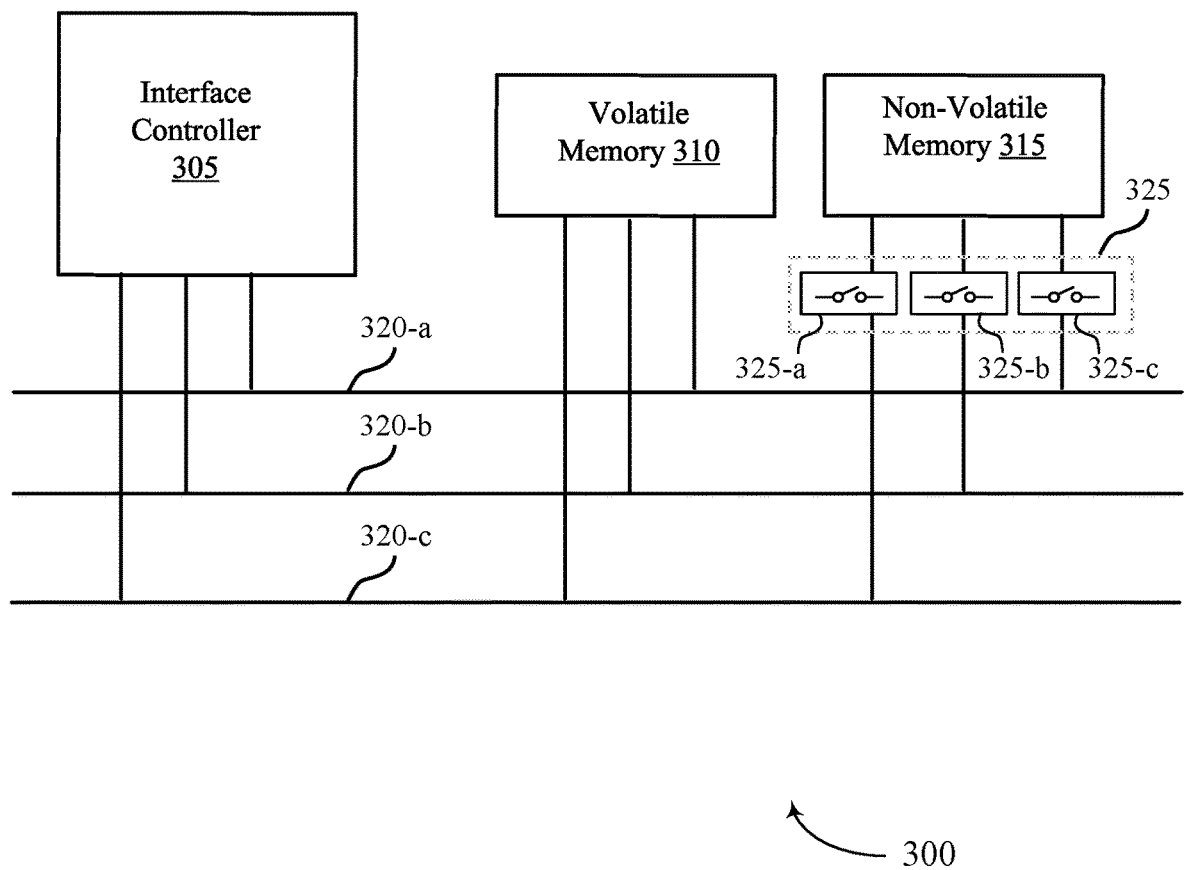
FIG. 3 illustrates an example of a memory subsystem that supports power supply control for non-volatile memory in accordance with examples as disclosed herein.

In some examples, interface controller 202 may determine whether a criterion associated with accessing non-volatile memory 206 is satisfied, and may deactivate a switching component to decouple non-volatile memory 206 from a supply rail (e.g., a conductive path that provides a supply voltage to non-volatile memory 206) based on determining that the criterion is satisfied, as described more herein, such as with reference to FIG. 3.

FIG. 3 illustrates an example of a memory subsystem 300 that supports power supply control for non-volatile memory in accordance with examples as disclosed herein. The memory subsystem 300 may be an example of the memory subsystem 110 or memory subsystem 200 described with reference to FIG. 1 or 2, respectively, and may be included in or referred to as a memory device. The memory subsystem 300 may include an interface controller 305, a volatile memory 310, and a non-volatile memory 315, which may be examples of the interface controller 115, the volatile memory 120, and the non-volatile memory 125, respectively, as described with reference to FIG. 1.

Memory subsystem 300 may include one or more power supply rails 320, such as power supply rail 320-a, 320-b, 320-c. In some examples, each power supply rail 320 may be coupled with one or more of interface controller 305, volatile memory 310, and non-volatile memory 315 to provide a supply voltage to one or more of interface controller 305, volatile memory 310, and non-volatile memory 315. In some examples, each power supply rail 320 may provide a different supply voltage to one or more of these components.

For example, power supply rail 320-a may provide a VDDQ voltage, power supply rail 320-b may provide a VDD1 voltage, and power supply rail 320-c may provide a VDD2H voltage. Such voltages may be the same or different, and may provide power to various elements within interface controller 305, volatile memory 310, and non-volatile memory 315. For example, a VDDQ voltage may provide power to a physical layer of components of memory subsystem 300, such as to I/O blocks of one or more of interface controller 305, volatile memory 310, and non-volatile memory 315. VDD1 may be used to provide power to analog components, for memory core operation, as a high supply voltage for a phase locked loop (PLL) of memory subsystem 300, or for other purposes, for example. VDD2H may provide the main supply voltage for memory data-path operation, for example.

Other memory subsystems may provide a different quantity of power supply rails that may provide the same or different supply voltages without departing from the scope of the invention.

Each power supply rail 320 may be coupled with a voltage supply component (e.g., a voltage regulator, power supply) that drives the corresponding supply voltage onto the power supply rail 320. Memory subsystem 300 may receive the supply voltage via one or more pins of memory subsystem 300, for example, which may be coupled with electrical contacts (e.g., balls) of a package containing memory subsystem 300, for example.

Memory subsystem 300 may include switching component 325 to selectively couple (e.g., electrically connect) and uncouple (e.g., electrically isolate) non-volatile memory 315 from one or more power supply rails 320. In some examples, switching component 325 may include separate switching components 325-a, 325-b, 325-c for corresponding power supply rails 320-a, 320-b, 320-c such that each power supply rail 320 may be selectively coupled or uncoupled from non-volatile memory 315 by activating or deactivating the corresponding switching component 325. In some examples, the switching component 325 or one or more of the separate switching components 325-a, 325-b, or 325-c may be on a same die as one or more other components, such as the non-volatile memory 315. In some examples, the switching component 325 or one or more of the separate switching components 325-a, 325-b, or 325-c may be within a same package as the interface controller 305, the volatile memory 310, and the non-volatile memory 315.

In some examples, interface controller 305 may couple or uncouple non-volatile memory 315 with one or more power supply rails 320 by activating or deactivating (respectively) one or more switching components 325, such as by transmitting a control signal to one or more switching components 325.

In some examples, switching component 325 may represent or may include one or more physical switching components, such as one or more transistors or other type of switching circuitry. In some examples, one or more of switching components 325-a, 325-b, 325-c may represent or may include a physical switch. Using a physical switching component(s) rather than using software-implemented switching functionality may reduce leakage current when switching component 325 is deactivated, for example, and may enable switching component 325 to be activated (e.g., by interface controller 305) when non-volatile memory 315 is powered down.

Interface controller 305 may be configured to determine whether a criterion associated with accessing non-volatile memory 315 is satisfied, and in response to determining that the criterion is satisfied, to deactivate one or more switching components 325 (e.g., one or more of switching components 325-a, 325-b, 325-c) to uncouple non-volatile memory 315 from one or more power supply rails 320. In response to determining that the criterion is not satisfied, interface controller 305 may activate one or more switching components 325 to couple non-volatile memory 315 with one or more power supply rails 320 (e.g., if switching component 325 is currently deactivated), or interface controller 305 may refrain from deactivating one or more switching components 325 (e.g., if switching component 325 is already activated).

Various examples of criteria that interface controller 305 may use to determine whether to power down non-volatile memory 315 (e.g., by determining whether one or more criterion are satisfied) are described below. These examples are not intended to be exhaustive, but instead illustrate the broader disclosure principles and elements describe herein.

For example, interface controller 305 may determine whether memory subsystem 300 is operating in a particular (first) mode, such as a scratchpad mode. In some examples, a scratchpad mode may be a mode in which memory subsystem 300 may access volatile memory 310 but may not access non-volatile memory 315, or a mode in which interface controller 305 may transfer information from volatile memory 310 to non-volatile memory 315 in the background. Memory subsystem 300 may operate in a scratchpad mode to provide lower-latency accesses for certain latency-sensitive applications such as streaming audio, for example. In some examples, the criterion may be satisfied when interface controller 305 determines that the memory subsystem 300 is operating in the first mode. In response to determining that the criterion is satisfied (e.g., in response to determining that memory subsystem 300 is operating in the first mode), interface controller 305 may deactivate one or more of switching components 325 to uncouple non-volatile memory 315 from one or more power supply rails 320, thereby powering down non-volatile memory 315 to conserve power.

In some examples, before deactivating non-volatile memory 315, interface controller 305 may transfer data stored in non-volatile memory 315 to volatile memory interface controller 305 so that such data is available in volatile memory 310 after non-volatile memory 315 is powered down. Such transfers may incur some overhead associated with powering down non-volatile memory 315, for example. Thus, in some examples, interface controller 305 may determine whether to power down non-volatile memory 315 based on a projected duration (e.g., a duration of time) during which memory subsystem 300 expects to be operating in the first mode to avoid introducing overhead associated with powering down non-volatile memory 315 in cases where memory subsystem 300 is expected to operate in the first mode for a relatively short duration.

For example, if interface controller 305 determines that memory subsystem 300 will be operating in the first mode (e.g., scratchpad mode) for a relatively long duration, interface controller 305 may determine that the criterion is satisfied and may power down non-volatile memory 315 (by deactivating one or more switching components 325).

By contrast, if interface controller 305 determines that memory subsystem 300 will be operating in the first mode for a relatively short duration, interface controller 305 may determine that the criterion is not satisfied, and may refrain from powering down non-volatile memory 315 (e.g., by refraining from deactivating one or more switching components 325). Thus, in some examples, interface controller 305 may determine whether the criterion is satisfied by determining, either before or after determining that memory subsystem 300 is operating in the first mode, a projected duration during which the memory subsystem 300 will be operating in the first mode. In some examples, the criterion is satisfied when the projected duration satisfies a threshold, such as a minimum duration. In some examples, in response to determining that the projected duration satisfies the threshold, interface controller 305 may deactivate one or more switching components 325 to uncouple non-volatile memory 315 from one or more power supply rails 320, thereby powering down non-volatile memory 315.

In some examples, interface controller 305 may determine whether the criterion is satisfied based on determining whether information to be retrieved by interface controller 305 resides in the volatile memory 310 such that interface controller 305 may not access non-volatile memory 315. For example, if non-volatile memory 315 is powered down (e.g., one or more switching components 325 are deactivated such that non-volatile memory 315 is uncoupled from one or more power supply rails 320) and memory subsystem 300 receives a request for data (e.g., from a host device), interface controller 305 may determine whether the requested data resides (e.g., is located, available) in volatile memory 310. In response to determining that the requested data does not reside in volatile memory 310, interface controller 305 may activate one or more switching components 325 to couple non-volatile memory 315 with one or more power supply rails 320 to power up non-volatile memory 315, and may then read the data from non-volatile memory 315 and transmit the data to the host device.

Conversely, in response to determining that the requested data resides in volatile memory 310, interface controller 305 may refrain from activating one or more switching components 325 to couple non-volatile memory 315 with one or more power supply rails 320, such that non-volatile memory 315 remains powered down. Interface controller 305 may instead read the requested data from volatile memory 310 and transmit the data to the host device.

In some examples, memory subsystem 300 may be included in a device that may, at times, enter a power-saving mode of operation, such as a sleep mode, in which the power (e.g., voltage, current) supplied to some of the components of the device may be reduced. For example, some cellular devices may periodically enter a sleep mode to conserve power, and may periodically exit the sleep mode (e.g., wake up) to check for incoming messages or to transmit a signal (such as a status signal) to another device before returning to the sleep mode. In some examples, a memory subsystem 300 within such a cellular device may enter a sleep mode during such periods, in which some or all of the circuitry of memory subsystem 300 is deactivated or powered down.

In some examples, memory subsystem 300 may receive an indication associated with causing the memory subsystem 300 to enter a power-saving mode of operation. For example, memory subsystem 300 may receive a command from a host device that may cause the memory subsystem 300 to enter the power-saving mode, or the memory subsystem 300 may periodically enter a power-saving mode based on an output of a timer (e.g., if the memory subsystem periodically enters and exits a power-saving mode of operation based on predetermined active and inactive time durations).

In some examples, memory subsystem 300 may, in response to receiving the indication associated with causing memory subsystem 300 to enter the power-saving mode of operations, transfer data from non-volatile memory 315 to volatile memory 310 (e.g., in preparation for entering the power-saving mode of operation). In some examples, memory subsystem 300 may enter the power-saving mode after transferring the data from non-volatile memory 315 to volatile memory 310.

Such data may include, for example, data that may be used by memory subsystem 300 when memory subsystem 300 exits the power-saving mode of operation, such as when memory subsystem 300 periodically "wakes up" to check for incoming messages or to transmit a status signal to another device. By transferring such data to volatile memory 310 before entering the power-saving mode of operation, memory subsystem 300 may be able to leave non-volatile memory 315 powered down during some periods in which memory subsystem 300 wakes up. That is, in some examples, memory subsystem 300 may refrain from activating one or more switching components 325 (e.g., when memory subsystem wakes up) to couple non-volatile memory 315 with one or more power supply rails 320 based on determining that such data has been transferred from non-volatile memory 315 to volatile memory 310.

In some examples, memory subsystem 300 may deactivate one or more switching components 325 to uncouple non-volatile memory 315 from one or more power supply rails 320 in response to receiving a command from a host device. That is, memory subsystem 300 may determine whether a command has been received from the host device, and may deactivate one or more switching components 325 based on receiving the command.

Figure 4:
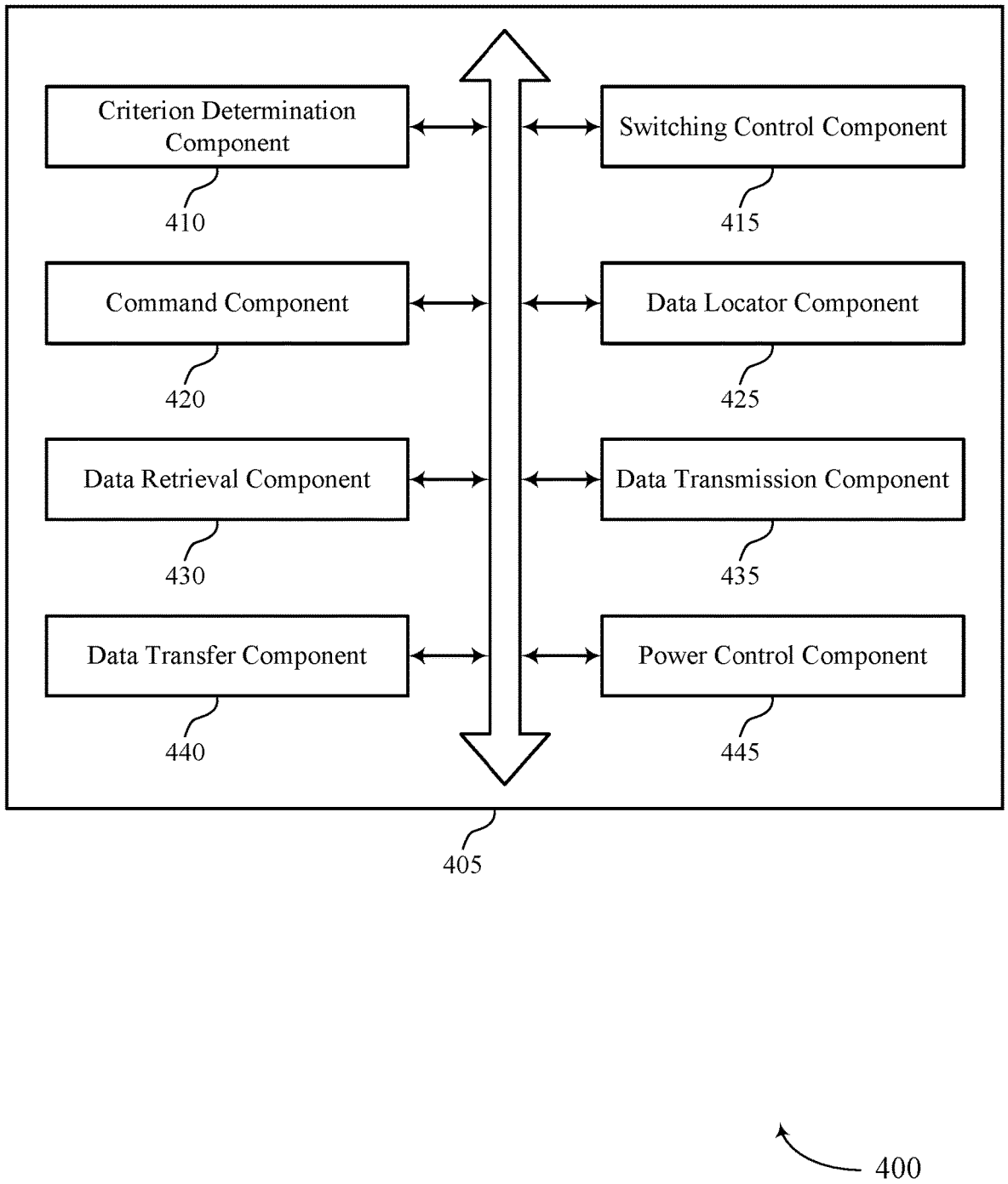
FIG. 4 shows a block diagram of a memory device that supports power supply control for non-volatile memory in accordance with examples as disclosed herein.

FIG. 4 shows a block diagram 400 of a memory device 405 that supports power supply control for non-volatile memory in accordance with examples as disclosed herein. The memory device 405 may be an example of or may include aspects of a memory subsystem as described with reference to FIGS. 1 through 3. The memory device 405 may include a criterion determination component 410, a switching control component 415, a command component 420, a data locator component 425, a data retrieval component 430, a data transmission component 435, a data transfer component 440, and a power control component 445. Each of these modules may communicate, directly or indirectly, with one another (e.g., via one or more buses).

The criterion determination component 410 may determine, by a control component of a memory device, whether a criterion associated with accessing a non-volatile memory of the memory device is satisfied.

In some examples, the criterion determination component 410 may determine whether the memory device is operating in a first mode, where the criterion is satisfied when the memory device is operating in the first mode, the first mode including a scratchpad mode.

In some examples, determining, before or after determining whether the memory device is operating in the first mode, a projected duration during which the memory device will be operating in the first mode, where determining whether the criterion associated with accessing the non-volatile memory includes determining whether the projected duration satisfies a threshold, and where the criterion is satisfied when the projected duration satisfies the threshold.

In some cases, the first supply rail includes a VDD supply rail associated with supplying a VDD voltage to the non-volatile memory, the control component, and the volatile memory.

The switching control component 415 may deactivate a switching component to uncouple the non-volatile memory from a first supply rail based on determining that the criterion is satisfied, where the first supply rail is coupled with a volatile memory of the memory device and with the control component.

In some examples, the switching control component 415 may cause the switching component to be activated to couple the non-volatile memory with the first supply rail based on determining that the data does not reside in the volatile memory.

In some examples, the switching control component 415 may activate the switching component to couple the non-volatile memory with the first supply rail before determining whether the criterion is satisfied.

In some examples, the switching control component 415 may refrain from deactivating the switching component based on determining that the criterion is not satisfied.

In some examples, the switching control component 415 may activate the switching component to couple the non-volatile memory with the first supply rail based on determining that the criterion is not satisfied. In some cases, the switching component is a physical switching component coupled between a first power supply component and the non-volatile memory.

The command component 420 may receive, from a host device after deactivating the switching component, a request for data.

In some examples, the command component 420 may receive an indication associated with causing the memory device to enter a power-saving mode of operation.

In some examples, receiving, from a host device before determining whether the criterion is satisfied, a command associated with deactivating the non-volatile memory, where determining whether the criterion is satisfied includes determining whether the command has been received, where the criterion is satisfied when the command has been received.

The data locator component 425 may determine whether the data resides in the volatile memory.

The data retrieval component 430 may read the data from the non-volatile memory based on activating the switching component.

The data transmission component 435 may transmit the data to the host device.

The data transfer component 440 may transfer second data from the non-volatile memory to the volatile memory based on receiving the indication, where determining whether the criterion is satisfied includes determining whether the second data has been transferred from the non-volatile memory to the volatile memory.

The power control component 445 may enter the power-saving mode of operation based on receiving the indication and transferring the second data from the non-volatile memory to the volatile memory.

Figure 5:
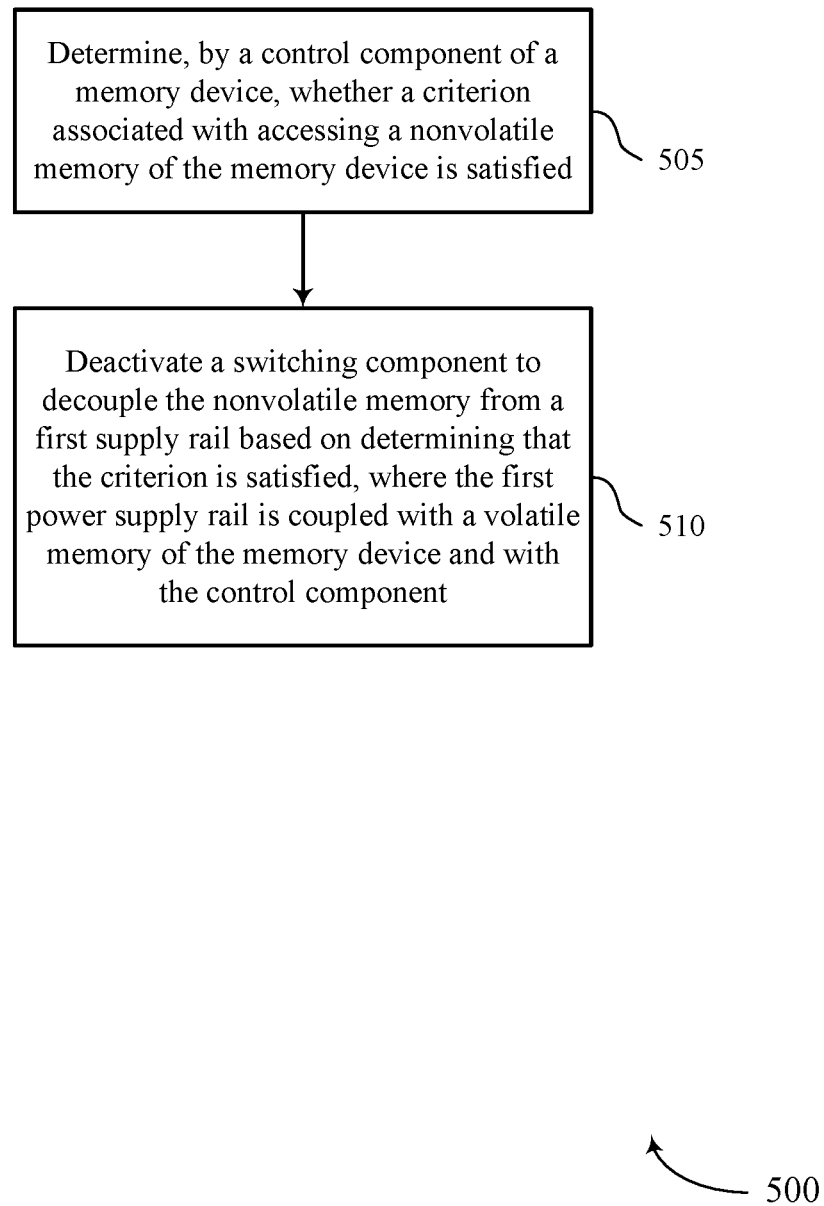
FIG. 5 shows a flowchart illustrating a method or methods that support power supply control for non-volatile memory in accordance with examples as disclosed herein.

FIG. 5 shows a flowchart illustrating a method or methods 500 that supports power supply control for non-volatile memory in accordance with aspects of the present disclosure. The operations of method 500 may be implemented by a memory device or its components as described herein. For example, the operations of method 500 may be performed by a memory device as described with reference to FIG. 4. In some examples, a memory device may execute a set of instructions to control the functional elements of the memory device to perform the described functions. Additionally or alternatively, a memory device may perform aspects of the described functions using special-purpose hardware.

At 505, the memory device may determine, by a control component of a memory device, whether a criterion associated with accessing a non-volatile memory of the memory device is satisfied. The operations of 505 may be performed according to the methods described herein. In some examples, aspects of the operations of 505 may be performed by a criterion determination component as described with reference to FIG. 4.

At 510, the memory device may deactivate a switching component to uncouple the non-volatile memory from a first supply rail based on determining that the criterion is satisfied, where the first supply rail is coupled with a volatile memory of the memory device and with the control component. The operations of 510 may be performed according to the methods described herein. In some examples, aspects of the operations of 510 may be performed by a switching control component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for determining, by a control component of a memory device, whether a criterion associated with accessing a non-volatile memory of the memory device is satisfied and deactivating a switching component to uncouple the non-volatile memory from a first supply rail based on determining that the criterion is satisfied, where the first supply rail is coupled with a volatile memory of the memory device and with the control component.

In some examples of the method 500 and the apparatus described herein, determining whether the criterion associated with accessing the non-volatile memory may include operations, features, means, or instructions for determining whether the memory device may be operating in a first mode, where the criterion may be satisfied when the memory device may be operating in the first mode, the first mode including a scratchpad mode.

Some examples of the method 500 and the apparatus described herein may further include operations, features, means, or instructions for determining, before or after determining whether the memory device may be operating in the first mode, a projected duration during which the memory device will be operating in the first mode, where determining whether the criterion associated with accessing the non-volatile memory includes determining whether the projected duration satisfies a threshold, and where the criterion may be satisfied when the projected duration satisfies the threshold.

Some examples of the method 500 and the apparatus described herein may further include operations, features, means, or instructions for receiving, from a host device after deactivating the switching component, a request for data, determining whether the data resides in the volatile memory, causing, by the control component, the switching component to be activated to couple the non-volatile memory with the first supply rail based on determining that the data does not reside in the volatile memory, reading the data from the non-volatile memory based on activating the switching component, and transmitting the data to the host device.

Some examples of the method 500 and the apparatus described herein may further include operations, features, means, or instructions for receiving an indication associated with causing the memory device to enter a power-saving mode of operation, transferring second data from the non-volatile memory to the volatile memory based on receiving the indication, where determining whether the criterion may be satisfied includes determining whether the second data may have been transferred from the non-volatile memory to the volatile memory, and entering the power-saving mode of operation based on receiving the indication and transferring the second data from the non-volatile memory to the volatile memory.

In some examples of the method 500 and the apparatus described herein, the first supply rail includes a VDD supply rail associated with supplying a VDD voltage to the non-volatile memory, the control component, and the volatile memory.

In some examples of the method 500 and the apparatus described herein, the switching component may be a physical switching component coupled between a first power supply component and the non-volatile memory.

Some examples of the method 500 and the apparatus described herein may further include operations, features, means, or instructions for receiving, from a host device before determining whether the criterion may be satisfied, a command associated with deactivating the non-volatile memory, where determining whether the criterion may be satisfied includes determining whether the command may have been received, where the criterion may be satisfied when the command may have been received.

Some examples of the method 500 and the apparatus described herein may further include operations, features, means, or instructions for activating the switching component to couple the non-volatile memory with the first supply rail before determining whether the criterion may be satisfied.

Some examples of the method 500 and the apparatus described herein may further include operations, features, means, or instructions for refraining from deactivating the switching component based on determining that the criterion may be not satisfied.

Some examples of the method 500 and the apparatus described herein may further include operations, features, means, or instructions for activating the switching component to couple the non-volatile memory with the first supply rail based on determining that the criterion may be not satisfied.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a non-volatile memory, a volatile memory, a control component coupled with the non-volatile memory and the volatile memory, a first supply rail coupled with the volatile memory and the control component and configured to supply a first voltage to the volatile memory and the control component, and a switching component coupled with the first supply rail and with the non-volatile memory, where the control component is configured to cause the apparatus to determine whether a criterion associated with accessing the non-volatile memory is satisfied and deactivate the switching component to uncouple the non-volatile memory from the first supply rail based on determining that the criterion is satisfied.

Some examples of the apparatus may include a second supply rail coupled with the volatile memory and the control component and configured to supply a second voltage to the volatile memory and the control component, a second switching component coupled with the second supply rail and with the non-volatile memory, and where the control component may be configured to cause the apparatus to deactivate the second switching component to uncouple the non-volatile memory from the second supply rail based on determining that the criterion may be satisfied.

Some examples may further include activating the switching component to couple the non-volatile memory with the first supply rail based on determining that the criterion may be not satisfied.

In some examples, the switching component may be on a same die as the non-volatile memory. In some examples, the switching component may be within a same package as the control component, the volatile memory, and the non-volatile memory.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

A protocol may define one or more communication procedures and one or more communication parameters supported for use by a device or component. For example, a protocol may define various operations, a timing and a frequency for those operations, a meaning of various commands or signals or both, one or more addressing scheme(s) for one or more memories, a type of communication for which pins are reserved, a size of data handled at various components such as interfaces, a data rate supported by various components such as interfaces, or a bandwidth supported by various components such as interfaces, among other parameters and metrics, or any combination thereof. Use of a shared protocol may enable interaction between devices because each device may operate in a manner expected, recognized, and understood by another device. For example, two devices that support the same protocol may interact according to the policies, procedures, and parameters defined by the protocol, whereas two devices that support different protocols may be incompatible.

To illustrate, two devices that support different protocols may be incompatible because the protocols define different addressing schemes (e.g., different quantities of address bits). As another illustration, two devices that support different protocols may be incompatible because the protocols define different transfer procedures for responding to a single command (e.g., the burst length or quantity of bytes permitted in response to the command may differ). Merely translating a command to an action should not be construed as use of two different protocols. Rather, two protocols may be considered different if corresponding procedures or parameters defined by the protocols vary. For example, a device may be said to support two different protocols if the device supports different addressing schemes, or different transfer procedures for responding to a command.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
    a volatile memory;
    a non-volatile memory; and
    an interface controller coupled with the volatile memory and the non-volatile memory and configured to cause the apparatus to:
        determine whether a criterion associated with accessing the non-volatile memory is satisfied;
        deactivate a switching component to uncouple the non-volatile memory from a first supply rail based at least in part on determining that the criterion is satisfied, wherein the first supply rail is coupled with the volatile memory and with the interface controller; and
        activate the switching component to couple the non-volatile memory with the first supply rail based at least in part on determining that data requested by a host device is absent from the volatile memory.

2. The apparatus of claim 1, wherein the first supply rail comprises a VDD supply rail associated with supplying a VDD voltage to the non-volatile memory, the interface controller, and the volatile memory.

3. The apparatus of claim 1, wherein the switching component is a physical switching component coupled between a first power supply component and the non-volatile memory.

4. The apparatus of claim 1, wherein the interface controller is configured to cause the apparatus to:
    receive, from a host device before determining whether the criterion is satisfied, a command associated with deactivating the non-volatile memory, wherein the interface controller is configured to determine whether the criterion is satisfied by determining whether the command has been received, wherein the criterion is satisfied when the command has been received.

5. The apparatus of claim 1, wherein the interface controller is configured to cause the apparatus to:
    activate the switching component to couple the non-volatile memory with the first supply rail based at least in part on determining that the criterion is not satisfied.

6. The apparatus of claim 1, wherein the interface controller is configured to cause the apparatus to:
    activate the switching component to couple the non-volatile memory with the first supply rail before determining whether the criterion is satisfied.

7. The apparatus of claim 6, wherein the interface controller is configured to cause the apparatus to:
    refrain from deactivating the switching component based at least in part on determining that the criterion is not satisfied.

8. An apparatus, comprising:
    a volatile memory;
    a non-volatile memory; and
    an interface controller coupled with the volatile memory and the non-volatile memory, wherein the interface controller is configured to cause the apparatus to:
        determine whether a criterion associated with accessing the non-volatile memory is satisfied by determining whether the apparatus is operating in a first mode, wherein the criterion is satisfied when the apparatus is operating in the first mode, the first mode comprising a scratchpad mode;
        deactivate a switching component to uncouple the non-volatile memory from a first supply rail based at least in part on determining that the criterion is satisfied, wherein the first supply rail is coupled with the volatile memory and with the interface controller; and
        determine, before or after determining whether the apparatus is operating in the first mode, a projected duration during which the apparatus will be operating in the first mode, wherein the interface controller is configured to cause the apparatus to determine whether the criterion associated with accessing the non-volatile memory is satisfied by determining whether the projected duration satisfies a threshold, and wherein the criterion is satisfied when the projected duration satisfies the threshold.

9. An apparatus, comprising:
    a volatile memory;
    a non-volatile memory; and
    an interface controller coupled with the volatile memory and the non-volatile memory, wherein the interface controller is configured to cause the apparatus to:

determine whether a criterion associated with accessing the non-volatile memory is satisfied;

deactivate a switching component to uncouple the non-volatile memory from a first supply rail based at least in part on determining that the criterion is satisfied, wherein the first supply rail is coupled with the volatile memory and with the interface controller;

receive, from a host device after deactivating the switching component, a request for data;

determine whether the data resides in the volatile memory;

cause the switching component to be activated to couple the non-volatile memory with the first supply rail based at least in part on determining that the data does not reside in the volatile memory;

read the data from the non-volatile memory based at least in part on activating the switching component; and transmit the data to the host device.

10. An apparatus, comprising:
a volatile memory;
a non-volatile memory; and
an interface controller coupled with the volatile memory and the non-volatile memory, wherein the interface controller is configured to cause the apparatus to:
receive an indication associated with causing the apparatus to enter a power-saving mode of operation;
transfer second data from the non-volatile memory to the volatile memory based at least in part on receiving the indication;
determine whether a criterion associated with accessing the non-volatile memory is satisfied, wherein the interface controller is configured to cause the apparatus to determine whether the criterion is satisfied by determining whether the second data has been transferred from the non-volatile memory to the volatile memory;
deactivate a switching component to uncouple the non-volatile memory from a first supply rail based at least in part on determining that the criterion is satisfied, wherein the first supply rail is coupled with the volatile memory and with the interface controller; and
enter the power-saving mode of operation based at least in part on receiving the indication and transferring the second data from the non-volatile memory to the volatile memory.

11. An apparatus, comprising:
a non-volatile memory,
a volatile memory,
an interface controller coupled with the non-volatile memory and the volatile memory,
a first supply rail coupled with the volatile memory and the interface controller and configured to supply a first voltage to the volatile memory and the interface controller, and
a switching component coupled with the interface controller, the first supply rail, and the non-volatile memory and configured to selectively couple the first supply rail with the non-volatile memory based at least in part on a signal received from the interface controller, wherein the interface controller is configured to cause the apparatus to:
deactivate the switching component to isolate the non-volatile memory from the first supply rail; and
activate the switching component to couple the non-volatile memory with the first supply rail based at least in part on data requested by a host device being absent from the volatile memory.

12. The apparatus of claim 11, further comprising:
a second supply rail coupled with the interface controller and the volatile memory and configured to supply a second voltage to the volatile memory and the interface controller; and
a second switching component coupled with the interface controller, the second supply rail, and the non-volatile memory and configured to selectively couple the second supply rail with the non-volatile memory based at least in part on a second signal received from the interface controller.

13. The apparatus of claim 11, wherein the interface controller is configured to cause the apparatus to:
activate the switching component to couple the non-volatile memory with the first supply rail based at least in part on determining that a criterion is not satisfied.

14. The apparatus of claim 11, wherein the switching component is on a same die as the non-volatile memory.

15. The apparatus of claim 11, wherein the switching component is within a same package as the interface controller, the volatile memory, and the non-volatile memory.

16. A non-transitory computer-readable medium storing code comprising instructions, which when executed by a processor of an electronic device, cause the electronic device to:
determine whether a criterion associated with accessing a non-volatile memory of the electronic device is satisfied;
deactivate a switching component to uncouple the non-volatile memory from a first supply rail based at least in part on determining that the criterion is satisfied, wherein the first supply rail is coupled with a volatile memory of the electronic device and with an interface controller of the electronic device; and
activate the switching component to couple the non-volatile memory with the first supply rail based at least in part on determining that data requested by a host device is absent from the volatile memory.

17. The non-transitory computer-readable medium of claim 16, wherein the instructions, when executed by the processor of the electronic device, further cause the electronic device to:
receive, from a host device after deactivating the switching component, a request for data;
determine whether the data resides in the volatile memory;
read the data from the non-volatile memory based at least in part on activating the switching component; and
transmit the data to the host device.

18. The non-transitory computer-readable medium of claim 16, wherein the instructions, when executed by the processor of the electronic device, further cause the electronic device to:
receive an indication associated with causing the electronic device to enter a power-saving mode of operation;
transfer second data from the non-volatile memory to the volatile memory based at least in part on receiving the indication, wherein determining whether the criterion is satisfied comprises determining whether the second data has been transferred from the non-volatile memory to the volatile memory; and
enter the power-saving mode of operation based at least in part on receiving the indication and transferring the second data from the non-volatile memory to the volatile memory.

19. The non-transitory computer-readable medium of claim 16, wherein the instructions, when executed by the processor of the electronic device, further cause the electronic device to:

receive, from a host device before determining whether the criterion is satisfied, a command associated with deactivating the non-volatile memory, wherein determining whether the criterion is satisfied comprises determining whether the command has been received, wherein the criterion is satisfied when the command has been received.

20. The non-transitory computer-readable medium of claim 16, wherein the instructions, when executed by the processor of the electronic device, further cause the electronic device to:

activate the switching component to couple the non-volatile memory with the first supply rail based at least in part on determining that the criterion is not satisfied.

21. The non-transitory computer-readable medium of claim 16, wherein determining whether the criterion associated with accessing the non-volatile memory comprises determining whether the electronic device is operating in a first mode, wherein the criterion is satisfied when the electronic device is operating in the first mode, the first mode comprising a scratchpad mode.

22. The non-transitory computer-readable medium of claim 21, wherein the instructions, when executed by the processor of the electronic device, further cause the electronic device to:

determine, before or after determining whether the electronic device is operating in the first mode, a projected duration during which the electronic device will be operating in the first mode, wherein determining whether the criterion associated with accessing the non-volatile memory is satisfied comprises determining whether the projected duration satisfies a threshold, and wherein the criterion is satisfied when the projected duration satisfies the threshold.

23. The non-transitory computer-readable medium of claim 16, wherein the instructions, when executed by the processor of the electronic device, further cause the electronic device to:

activate the switching component to couple the non-volatile memory with the first supply rail before determining whether the criterion is satisfied.

24. The non-transitory computer-readable medium of claim 23, wherein the instructions, when executed by the processor of the electronic device, further cause the electronic device to:

refrain from deactivating the switching component based at least in part on determining that the criterion is not satisfied.

* * * * *